US012790201B2

(12) United States Patent
Fukutome

(10) Patent No.: US 12,790,201 B2
(45) Date of Patent: Nov. 10, 2026

(54) MEMS ELEMENT

(71) Applicant: Nisshinbo Micro Devices Inc., Tokyo (JP)

(72) Inventor: Takao Fukutome, Saitama (JP)

(73) Assignee: Nisshinbo Micro Devices Inc., Tokyo (JP)

(*) Notice: Subject to any disclaimer, the term of this patent is extended or adjusted under 35 U.S.C. 154(b) by 306 days.

(21) Appl. No.: 18/837,813

(22) PCT Filed: Feb. 22, 2022

(86) PCT No.: PCT/JP2022/007309
§ 371 (c)(1),
(2) Date: Aug. 12, 2024

(87) PCT Pub. No.: WO2023/162019
PCT Pub. Date: Aug. 31, 2023

(65) Prior Publication Data

US 2025/0145449 A1 May 8, 2025

(51) Int. Cl.

| | |
|---|---|
| ***H04R 19/04*** | (2006.01) |
| ***B81B 3/00*** | (2006.01) |
| ***H04R 7/06*** | (2006.01) |

(52) U.S. Cl.
CPC ............. *B81B 3/0051* (2013.01); *H04R 7/06* (2013.01); *H04R 19/04* (2013.01);
(Continued)

(58) Field of Classification Search
CPC ........ B81B 3/0051; H04R 19/04; H04R 7/06; H04R 31/00; H04R 2201/0257;
(Continued)

(56) References Cited

U.S. PATENT DOCUMENTS

| | | | |
|---|---|---|---|
| 2004/0129492 | A1 | 7/2004 | Bertagni et al. |
| 2015/0078592 | A1 | 3/2015 | Uchida |

(Continued)

FOREIGN PATENT DOCUMENTS

| | | | |
|---|---|---|---|
| CN | 1787693 | A | 6/2006 |
| CN | 104469640 | B | 12/2017 |

(Continued)

OTHER PUBLICATIONS

Korean Office Action for Application No. 10-2024-7017058 dated Nov. 2025 (9 pages with translation).

(Continued)

*Primary Examiner* — Alonzo Chambliss
(74) *Attorney, Agent, or Firm* — Dinsmore & Shohl LLP

(57) ABSTRACT

A MEMS element in which a backplate including a fixed electrode and a vibrating membrane including a movable electrode are disposed on a substrate including a back chamber, so as to face each other via a spacer, the vibrating membrane includes a pillar connected to the backplate, pillar side slits, and peripheral portion side slits, and a plurality of vibrating portion is formed in the vibrating membrane. The central portion of the vibrating membrane is connected to the backplate by the pillar, so that the amplitude of the central portion can be suppressed. In each of a plurality of vibrating portions, the pillar side slits are disposed on a portion side in which the pillar and the vibrating membrane are joined and the peripheral portion side slits are disposed at the peripheral portion, thereby decreasing the difference in the amplitude amount between the central portion and the peripheral portion.

20 Claims, 6 Drawing Sheets

(52) U.S. Cl.
CPC ................. *B81B 2201/0257* (2013.01); *B81B 2203/0127* (2013.01); *B81B 2203/0353* (2013.01); *B81B 2203/0361* (2013.01); *B81B 2203/04* (2013.01)

(58) Field of Classification Search
CPC .... H04R 2203/0127; H04R 2203/0353; H04R 2203/0361; H04R 2203/04
See application file for complete search history.

(56) References Cited

U.S. PATENT DOCUMENTS

| | | | | |
|---|---|---|---|---|
| 2015/0078593 | A1 | 3/2015 | Uchida | |
| 2015/0369653 | A1 | 12/2015 | Inoue | |
| 2018/0170745 | A1 | 6/2018 | Barzen et al. | |
| 2018/0184212 | A1 | 6/2018 | Kasai et al. | |
| 2019/0082268 | A1* | 3/2019 | Yoo | H04R 19/04 |
| 2021/0136483 | A1* | 5/2021 | Hsieh | H04R 19/04 |

FOREIGN PATENT DOCUMENTS

| | | | | |
|---|---|---|---|---|
| CN | 110603818 | A | | 12/2019 |
| CN | 107852558 | B | | 2/2020 |
| JP | 2010057167 | A | | 3/2010 |
| JP | 2011055087 | A | | 3/2011 |
| JP | 2012138946 | A | * | 7/2012 |
| JP | 2015056832 | A | | 3/2015 |
| JP | 2019126856 | A | | 8/2019 |

OTHER PUBLICATIONS

International Search Report dated Apr. 26, 2022; International Application No. PCT/JP2022/007309.

* cited by examiner

MEMS ELEMENT

CROSS-REFERENCE TO RELATED APPLICATIONS

This application is the U.S. National Stage of PCT/JP2022/007309 filed on Feb. 22, 2022, the contents of which are incorporated herein by reference in their entirety.

FIELD OF THE INVENTION

The present disclosure relates to a capacitance-type MEMS element used as a microphone, various sensors, and the like.

BACKGROUND OF THE INVENTION

As a MEMS (Micro electro mechanical systems) element using a semiconductor process, a capacitance-type MEMS element is known, in which a backplate including a fixed electrode equipped with a plurality of acoustic holes, and a vibrating membrane including a movable electrode are disposed on a substrate across an insulating film to be a spacer.

The capacitance-type MEMS element detects, as a capacitance change between the movable electrode and the fixed electrode, displacement of the movable electrode caused by a vibration of the vibrating membrane and outputs a detection signal. This type of MEMS element is disclosed in Patent Document 1, for example.

PRIOR ART DOCUMENT

Patent Document

Patent Document 1: JP 2011-055087 A

SUMMARY OF THE INVENTION

Problem to be Solved by the Invention

A schematic cross-sectional view to explain a conventional capacitance-type MEMS element is shown in FIG. 11, for example. As shown in FIG. 11, in the conventional capacitance-type MEMS element, an insulating film 52 is formed on a substrate 51 to be a support substrate and a vibrating membrane 53 including a conductive movable electrode is formed on the above-mentioned insulating film 52. Moreover, a spacer 54 formed of an insulating film and a backplate 57 composed of a conductive fixed electrode 55 and an insulating film 56 are laminated, forming an air gap structure. Letter 58 is an acoustic hole formed in the backplate 57, letter 59 is a back chamber formed in the substrate 51, and letter 60 is a slit formed at the peripheral portion of the vibrating membrane 53. When a sound pressure and the like are applied to such a capacitance-type MEMS element, the central portion of the vibrating membrane 53 vibrates to a large extent. At this time, the peripheral portion of the vibrating membrane 53, which is joined to the substrate 51 and the spacer 54, is made easy to vibrate by the slit 60 being formed, but compared to the amplitude at the central portion, the amplitude at the peripheral portion is smaller.

Generally, in the capacitance-type MEMS element, when the spring constant of the vibrating membrane 53 is reduced to increase the sensitivity, displacement becomes too large, causing the vibrating membrane 53 and the backplate 57 to be in contact with each other or causing a difference to be produced in the respective amplitude amounts at the central portion of the vibrating membrane 53, at which the displacement is large, and at the peripheral portion, at which the displacement is small. As a result, there is a problem that the area of the vibrating membrane 53 being displaced parallel to the backplate 57 becomes small and the AOP (Acoustic overload point) is deteriorated.

However, in a case that the capacitance-type MEMS element is used as a microphone, it is necessary to improve the AOP while suppressing the reduction in sensitivity as much as possible.

Thus, a problem to be solved of the present disclosure is to provide a MEMS element having an excellent sensitivity and an improved AOP.

Means to Solve the Problem

A MEMS element of the present disclosure, in one embodiment, comprises: a substrate comprising a back chamber; a vibrating membrane joined onto the substrate, wherein the vibrating membrane comprises a movable electrode; and a backplate comprising a fixed electrode disposed so as to face the movable electrode, wherein the vibrating membrane: has, at a central portion thereof, a pillar that connects the backplate and the vibrating membrane; and has a plurality of vibrating portions in a region between a portion in which the pillar and the vibrating membrane are joined and a peripheral portion of the vibrating membrane, and wherein each of the plurality of vibrating portions is formed by a region surrounded by a pillar side slit by a first slit portion and a second slit portion joined and a peripheral portion side slit disposed at the peripheral portion between an extension line toward the peripheral portion from the first slit portion and an extension line toward the peripheral portion from the second slit portion, the first slit portion and the second slit portion extending in mutually different directions toward the peripheral portion from a portion side in which the pillar and the vibrating membrane are joined.

Effects of the Invention

According to the MEMS element of the present disclosure, the central portion of the vibrating membrane is joined to the backplate by the pillar, so that the amplitude of the central portion of the vibrating membrane is suppressed and, moreover, the vibrating membrane is provided with slits, thereby making it possible to form a vibrating portion in which the difference in the amplitude amount is small between the central portion and the peripheral portion of the vibrating membrane. The vibrating portion is formed in a plurality on the vibrating membrane, and it is possible to obtain a large detection signal as a whole. Furthermore, by dividing a vibrating portion into a plurality of vibrating portions, each of which has a small area, when a bias voltage is applied between the fixed electrode and the movable electrode, a force applied to the respective vibrating portions is reduced, and the distortion of the detection signal is reduced. In this way, according to the present disclosure, providing a MEMS element that can improve the AOP without decreasing the sensitivity is made possible. As a result, a MEMS element for a high-performance microphone can be obtained.

DETAILED DESCRIPTION OF THE INVENTION

Next, embodiments of a MEMS element of the present disclosure will be described with reference to the drawings, but the present disclosure is not limited to these embodiments. Some of the dimensions are shown in an exaggerated manner for explanation of FIGS. 1 and 2, and 7 to 11, and the ratios of the dimensions of the respective members and portions are not accurately indicated.

Embodiment 1

Figure 1:
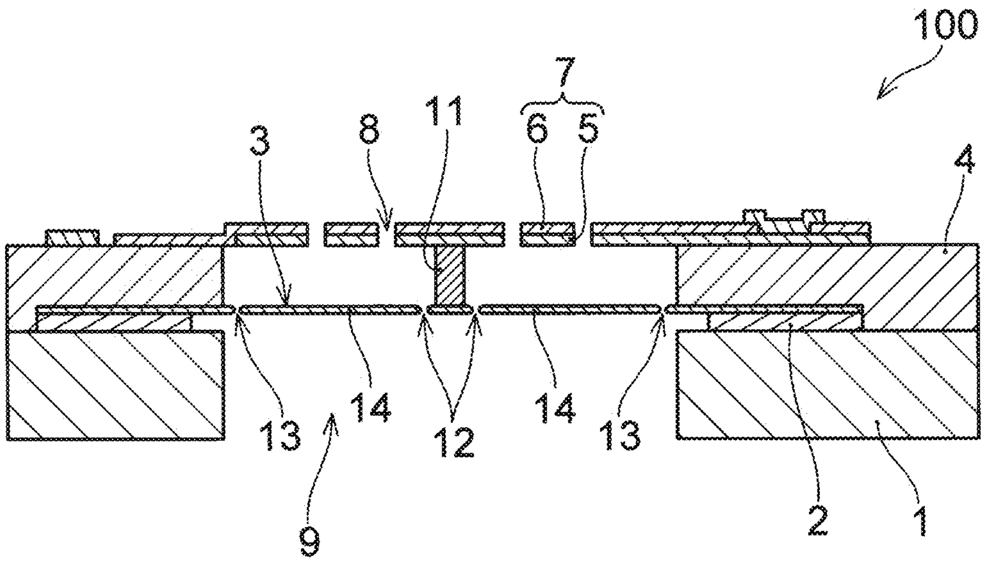
FIG. 1 is a schematic cross-sectional view of a MEMS element being one embodiment (Embodiment 1) of the present disclosure.

FIG. 1 is a schematic cross-sectional view to explain Embodiment 1 of a MEMS element of the present disclosure. As shown in FIG. 1, in one embodiment of a MEMS element 100 of the present disclosure, an insulating film 2 composed of a thermal oxide film and the like, for example, is formed on a substrate 1, as a support substrate, which is composed of a silicon substrate and the like, for example, and a vibrating membrane 3 including a conductive movable electrode composed of polysilicon and the like, for example, is formed on the insulating film 2. Moreover, an insulating spacer 4 composed of a USG (Undoped silicate glass) film and the like, for example, and a backplate 7 are laminated, which backplate 7 includes a conductive fixed electrode 5 composed of polysilicon and the like, for example, and an insulating film 6 composed of a silicon nitride and the like, for example.

In the MEMS element of the present embodiment, the vibrating membrane 3 and the backplate 7 are joined to a pillar 11, respectively, and connected to each other, and pillar side slits 12A to 12D and peripheral portion side slits 13A to 13D are provided.

Figure 2:
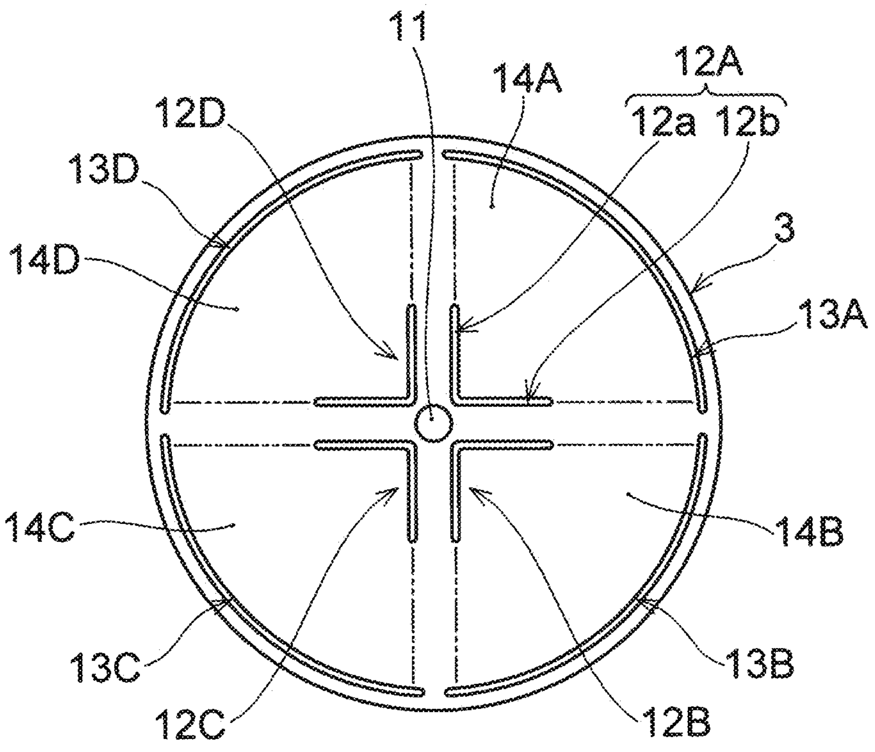
FIG. 2 is a schematic plan view to explain a vibrating membrane portion of Embodiment 1.

FIG. 2 is a schematic plan view to explain a vibrating membrane portion of the MEMS element shown in FIG. 1 and is a view to explain the arrangement of the pillar 11, the pillar side slits 12A to 12D, and the peripheral portion side slits 13A to 13D. A back chamber 9 formed in the substrate 1 in FIG. 1 is circularly shaped and the outer periphery in FIG. 2 corresponds to the outer periphery of the back chamber 9 of the substrate 1. The schematic cross-sectional view shown in FIG. 1 is a cross-sectional view passing through the center of the pillar 11 in FIG. 2, and the two pillar side slits 12A and 12C or 12B and 12D facing each other with the pillar 11 as the center.

In a case that a portion of the vibrating membrane 3, which corresponds to the back chamber 9, is circularly shaped as shown in FIG. 2, the circularly-shaped pillar 11 is disposed on the vibrating membrane 3 such that the center of the vibrating membrane 3 and the center of the circularly-shaped pillar 11 coincide. A plurality of vibrating portions 14A to 14D are formed in a region between a portion joined to the pillar 11 in the vibrating membrane 3 and the peripheral portion of the vibrating membrane 3. Therefore, the pillar side slits 12A to 12D and the peripheral portion side slits 13A to 13D are disposed around the pillar 11. In the present embodiment shown in FIG. 2, an example in which four of the vibrating portions 14A to 14D are formed is shown.

One vibrating portion being taken as an example will be described in detail. In the vibrating portion 14A formed in the upper-right side region of the vibrating membrane 3 with respect to the pillar 11 shown in FIG. 2, a pillar side slit 12A is formed by a first slit portion 12*a* and a second slit portion 12*b*, the first slit portion 12*a* extending from the pillar 11 side in the upward direction of the drawing which is parallel to the radial direction of the vibrating membrane 3, and the second slit portion 12*b* extending from the pillar 11 side in the right direction of the drawing which is parallel to the radial direction of the vibrating membrane 3, and being joined to the first slit portion 12*a* such that the second slit portion 12*b* intersects the first slit portion 12*a* at a joining angle of 90 degrees.

By forming the pillar side slit 12A, it is made easy for a part on the pillar 11 side in the vibrating membrane 3 to vibrate, a vibration of which part is restricted by the pillar 11.

Moreover, in the vibrating membrane 3, by forming the peripheral portion side slit 13A at the peripheral portion being joined to the substrate 1, the insulating film 2, and the spacer 4, it is made easy for the peripheral portion of the vibrating membrane 3 to vibrate, a vibration of which peripheral portion is restricted by being joined to the substrate 1 and the like. The peripheral portion side slit 13A achieves an effect similar to that of the slit 60 formed in a common MEMS element explained in FIG. 11, but, in particular, in order to make a region surrounded by an extension line in the extending direction of the first slit portion 12*a* and an extension line in the extending direction of the second slit portion 12*b*, respectively shown with a double-dashed line in FIG. 2, one vibrating portion, the peripheral portion side slit 13A of the present embodiment is formed to open to the positions intersecting the respective extension lines or in proximity thereto.

In this way, a region surrounded by the pillar side slit 12A and the peripheral portion side slit 13A is the one vibrating portion 14A. Similarly, a region surrounded by the pillar side slit 12B and the peripheral portion side slit 13B is the one vibrating portion 14B, a region surrounded by the pillar side slit 12C and the peripheral portion side slit 13C is the one vibrating portion 14C, and a region surrounded by the pillar side slit 12D and the peripheral portion side slit 13D is the one vibrating portion 14D. The plurality of vibrating portions 14A to 14D are four vibrating portions with uniform characteristics by the plurality of vibrating portions 14A to 14D being disposed evenly around the center of the pillar 11 (the center of the vibrating membrane 3).

Next, a vibration characteristic of the vibrating portion will be explained by taking a vibration characteristic of the vibrating portion 14A as an example. The vibration characteristic of the vibrating portion 14A varies depending on the material composing the vibrating membrane 3, the thickness, and the size thereof. Moreover, the vibration characteristic can be varied depending on the shape of the pillar side slit 12A and the peripheral portion side slit 13A. Besides, as long as the respective shapes of the vibrating portions 14B to 14D are identical to the shape of the vibrating portion 14A, the vibration characteristics of the vibrating portions 14B to 14D are identical to the vibration characteristic of the vibrating portion 14A, so that explanations thereof will be omitted.

Figure 3:
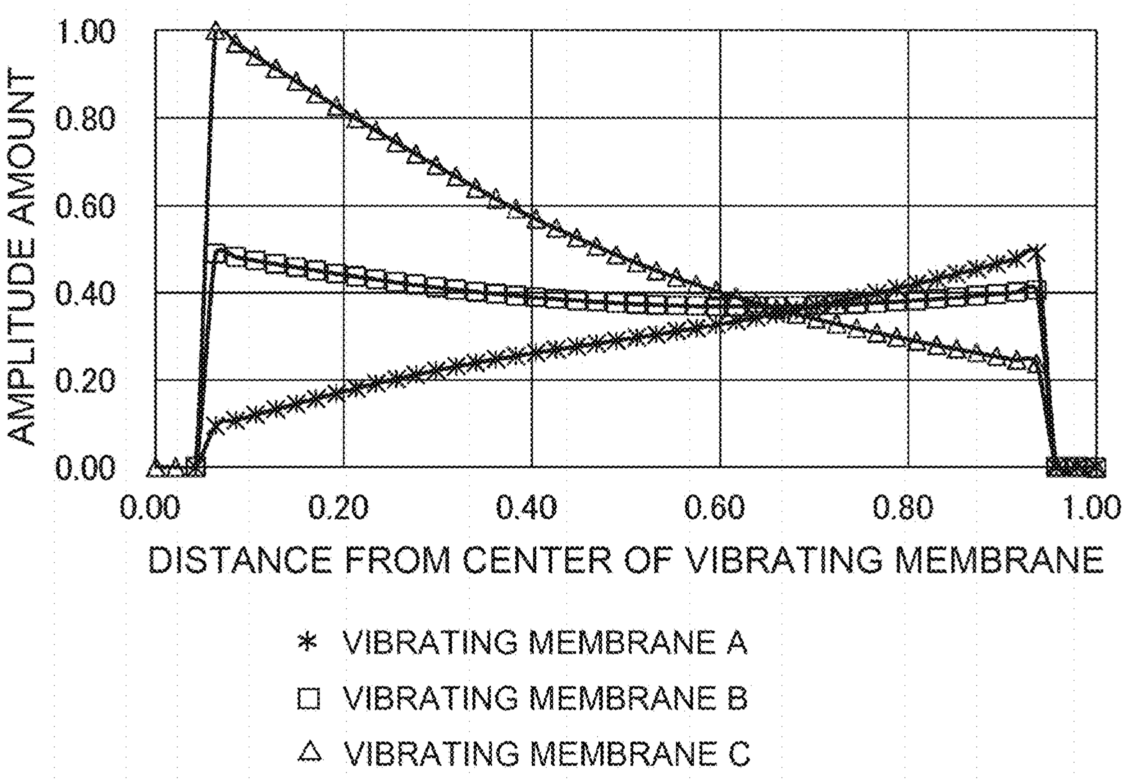
FIG. 3 is a view to explain a vibration characteristic of a vibrating portion of Embodiment 1.

FIGS. 3 to 6 are views to explain a vibration characteristic of the vibrating portion 14A of the MEMS element of the present embodiment. The vertical axis in FIG. 3 is the amplitude amount, which is shown as a relative amount with the maximum amplitude as 1.00. The horizontal axis in FIG. 3 is the distance from the center of the vibrating membrane 3, and the direction of the distance is the radial direction of the vibrating membrane 3, which radial direction passes from the center of the pillar 11 through a portion in which the first slit portion 12*a* and the second slit portion 12*b* of the pillar side slit 12A are joined, and the horizontal axis shows a relative distance with the center of the pillar 11 as 0.00 and the outer periphery shown in FIG. 2 as 1.00. In FIG. 3, the amplitude amounts of the vibrating portion 14A when the length in the extending direction of the pillar side slit 12A is varied as 19% (a vibrating membrane A), 38% (a vibrating membrane B), and 56% (a vibrating membrane C) are compared and here the length in the extending direction of the pillar side slit 12A is what is shown as a proportion with the length from the center of the pillar 11 to the outer periphery shown in FIG. 2 as 100. Conditions other than the length in the extending direction of the pillar side slit 12A are set to be identical.

As shown in FIG. 3, it is seen that all vibrate between the pillar side slit 12A and the peripheral portion side slit 13A. Moreover, it is seen that the greater the length of the pillar side slit 12A (the length of the slit: the vibrating membrane A<the vibrating membrane B<the vibrating membrane C), the greater the amplitude amount in proximity to the pillar side slit 12A (the amplitude amount: the vibrating membrane A<the vibrating membrane B<the vibrating membrane C). It is seen that each of the amplitude amounts in proximity to the peripheral portion side slit 13A also differs.

It is seen that, in a case of the vibrating membrane B in particular, a vibration occurs in which the amplitude amount is almost even in the entire vibrating portion 14A between the pillar side slit 12A and the peripheral portion side slit 13A. This shows that the movable electrode (the vibrating membrane 3) of the vibrating portion 14A is displaced while remaining almost parallel to the fixed electrode 5 facing each other. Therefore, in the present embodiment, from the point that the AOP is improved, the length of the pillar side slit 12A is preferably set to that of the vibrating membrane B of the vibrating membranes A to C.

Figure 4:
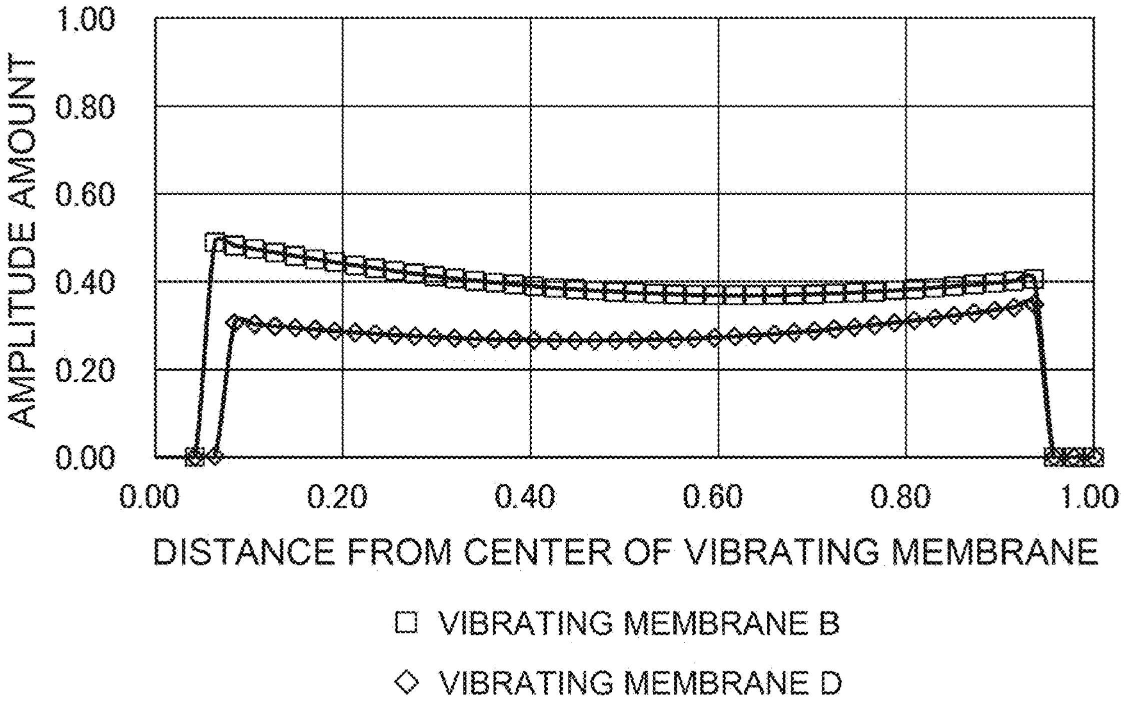
FIG. 4 is a view to explain a vibration characteristic of the vibrating portion of Embodiment 1.

Adjustment of the vibration characteristic of the vibrating portion 14A is not limited to adjustment by the length of the pillar side slit 12A explained in FIG. 3. Adjustment of the vibration characteristic of the vibrating portion 14A is also possible by changing the arrangement of the pillar side slit 12A. In FIG. 4, the vibrating film B shown in FIG. 3 is compared with amplitude amounts of the vibrating portion 14A in a vibration membrane D that is in a case in which the conditions such as the slit length and the like are set to be identical to those of the vibrating membrane B and the pillar side slit 12A is moved toward the peripheral portion side by a few percentages of what is from the pillar 11 to the position corresponding to the outer periphery shown in FIG. 2 as 100. It is seen that, as shown in FIG. 4, in a case that the pillar side slit 12A is moved to the peripheral portion side, the pillar side end of the vibrating region is moved from the center of the vibrating membrane to the peripheral portion side. Therefore, the shape of the vibrating portion 14A changes, varying the vibration characteristic. In this case, the area of the vibrating portion 14A is smaller and a relative amplitude amount is smaller. Thus, to obtain a desired vibration characteristic, it is desirable to determine the arrangement of the pillar side slit 12A. As a matter of course, even when the pillar side slit 12A is moved to the center side of the vibrating membrane 3, the shape of the vibrating portion 14A changes, varying the vibration characteristic. Moreover, even when the arrangement of the peripheral portion side slit 13A is varied, the shape of the vibrating portion 14A changes, varying the vibration characteristic. Therefore, the shape and arrangement are changed so as to result in a desired vibration characteristic. A case of the vibrating membrane B will be described below.

Figure 5:
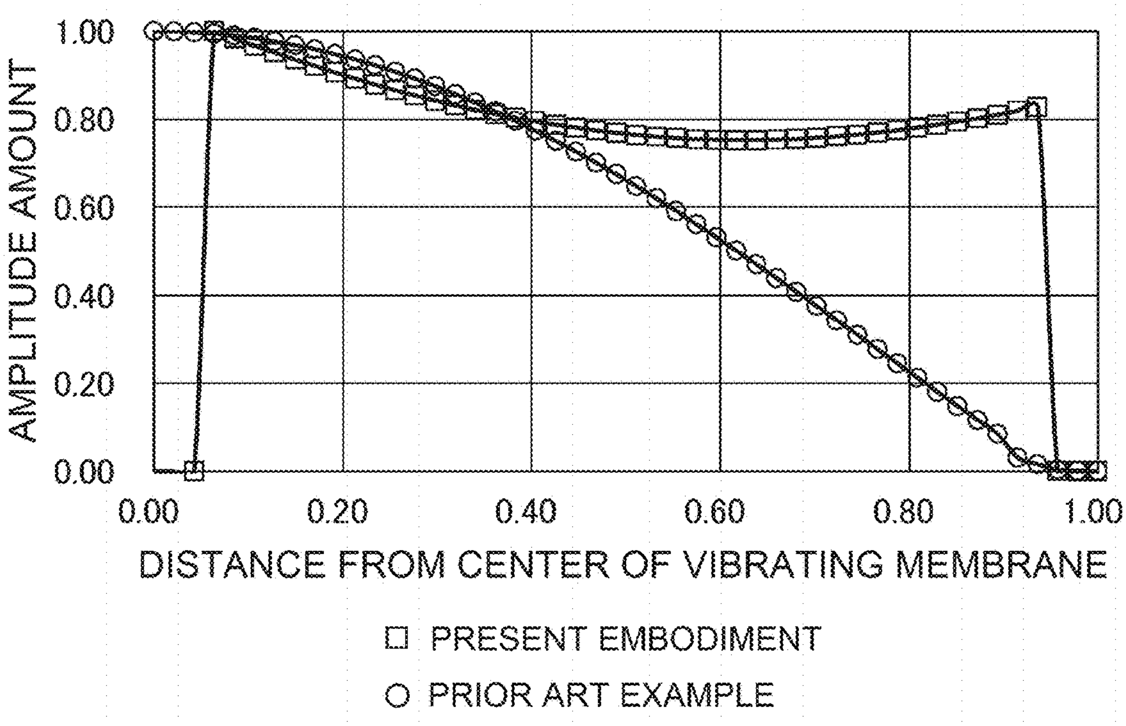
FIG. 5 is a view to explain a vibration characteristic of the vibrating portion of Embodiment 1.

FIG. 5 is a view to explain a vibrating characteristic of the vibrating portion 14A of the MEMS element of the present embodiment which comprises the vibrating membrane B, in comparison to a vibrating characteristic of a prior art example. The prior art example uses the vibrating membrane 53 of the common conventional MEMS element having a structure shown in FIG. 11. In FIG. 5, the respective amplitude amounts are shown as relative amounts with the respective maximum amplitudes as 1.00. The distance from the center of the vibrating membrane shows a relative distance with the vibrating membrane center as 0.00 and the position corresponding to the outer periphery shown in FIG. 2 as 1.00.

As shown in FIG. 5, in the common MEMS element shown as a prior art example, the amplitude amount at the center of the vibrating membrane 3 is maximal and the amplitude amount is smaller toward the peripheral portion. In other words, a region that can be expressed as a vibrating portion is up to a certain distance from the central portion, so it can be said that the periphery of the peripheral portion does not function as the vibrating portion. On the contrary, it is seen that, in the MEMS element of the present embodiment, the entire vibrating membrane in a region between the pillar side slit 12A and the peripheral portion side slit 13A vibrates relatively uniformly to function as the vibrating portion (the vibrating portion 14A).

In the present embodiment, as shown in FIG. 2, a vibrating portion is divided into the four vibrating portions 14A to 14D, thereby making a signal output from the respective vibrating portions smaller. However, a plurality of vibrating portions is provided and, as shown in FIG. 5, the area of the vibrating portion that is displaced in a manner almost parallel to the fixed electrode 5 in the radial direction of the vibrating membrane 3 increases; therefore, a sufficiently large sensitivity can be obtained.

Figure 6:
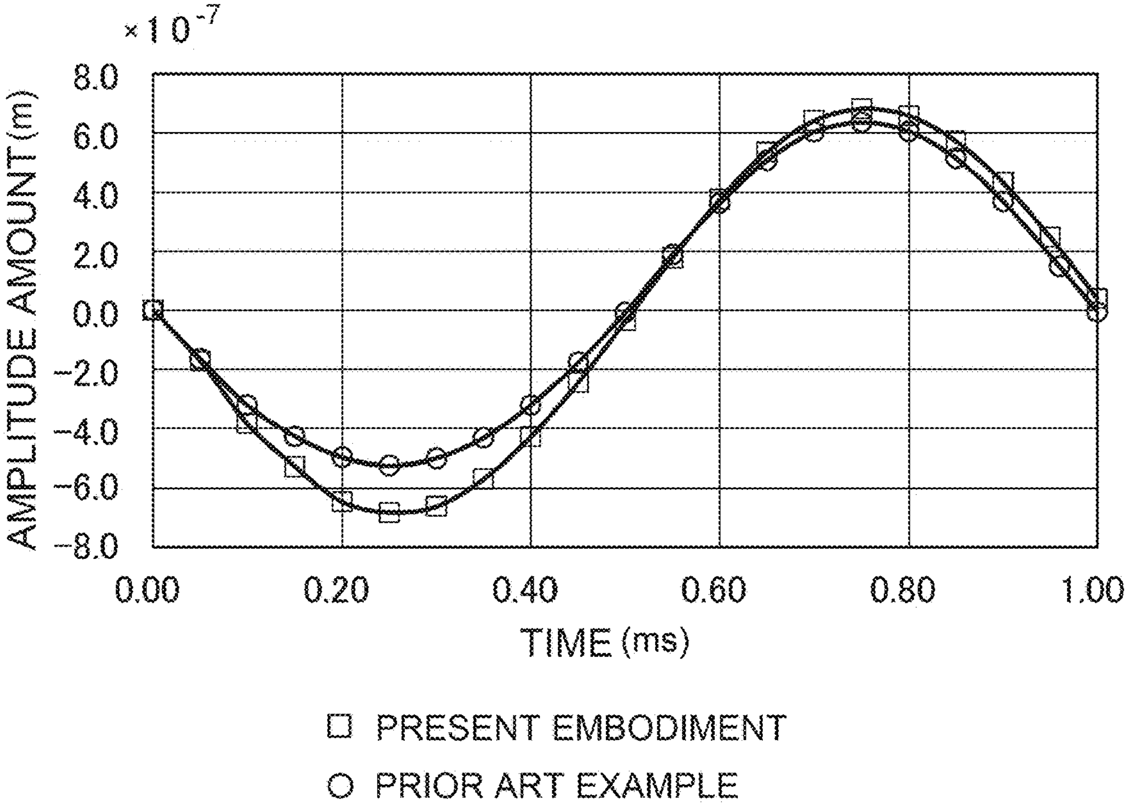
FIG. 6 is a view to explain a vibration characteristic of the vibrating portion of Embodiment 1.

Moreover, FIG. 6 shows a change in the amplitude amount when a sound pressure of 130 dB is provided to the vibrating membrane 3. There is no significant difference in the amplitude amount between the vibrating membrane B of the present embodiment and the vibrating membrane of the prior art example. However, it is seen that, when the changes in the amplitude amount are compared, the amplitude in the present embodiment changes more symmetrically than that in the prior art example. With the MEMS element of the present embodiment, in which the vibrating membrane 3 including the movable electrode is displaced in a manner almost parallel to the fixed electrode 5 In this way, the AOP is improved. Moreover, when the vibrating membrane 3 is composed of a material that has a small spring constant and vibrates easily, the force applied to the respective vibrating portions decreases when a bias voltage is applied between the fixed electrode 5 and the movable electrode, resulting in a smaller distortion of the detection signal, making it possible to improve the AOP. Besides, in the present embodiment, the pillar 11 is provided, so that a problem such as the vibrating membrane 3 vibrating too much, and the like never occurs even with the vibrating membrane 3 having a small spring constant.

Besides, as shown in FIG. 3 and the like, a vibration characteristic of the vibrating membrane 3 can be changed to a desired vibration characteristic as needed. Thus, the vibrating membrane 3 of the MEMS element of the present disclosure can be configured to comprise a plurality of vibrating portions having equal vibration characteristics, or can also be configured to combine vibrating portions having different vibration characteristics to complement each other. In the latter case, a configuration is possible in which, for example, a detection signal is obtained by combining a vibrating portion having a vibration characteristic in which the amplitude amount on the pillar side is relatively large and the amplitude amount on the peripheral portion side is relatively small and a vibrating portion having a vibration characteristic in which the amplitude amount on the pillar side is relatively small and the amplitude amount on the peripheral portion side is relatively large.

Embodiment 2

Figure 7:
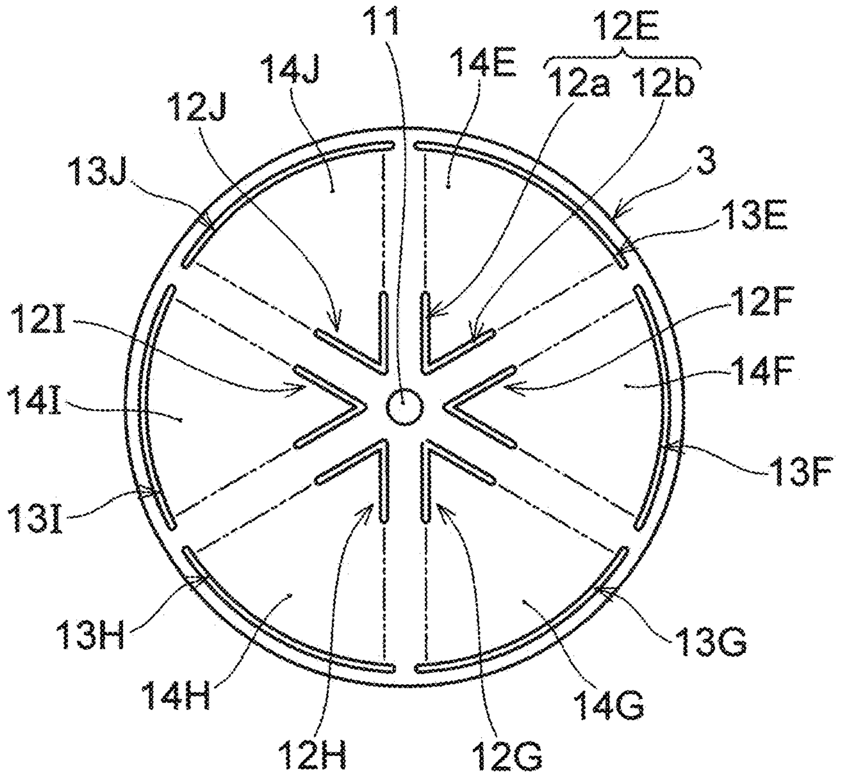
FIG. 7 is a schematic plan view to explain a vibrating membrane portion of the MEMS element being another embodiment (Embodiment 2) of the present disclosure.

Next, Embodiment 2 of the MEMS element of the present disclosure will be explained. FIG. 7 is a schematic plan view to explain a vibrating membrane portion of the MEMS element shown in FIG. 1 and is a view to explain the arrangement of the pillar 11, pillar side slits 12E to 12J, and peripheral portion side slits 13E to 13J. The back chamber 9 formed in the substrate 1 in FIG. 1 is circularly shaped and the outer periphery in FIG. 7 corresponds to the outer periphery of the back chamber 9 of the substrate 1.

In a case that a portion corresponding to the back chamber 9 of the vibrating membrane 3 is circularly shaped as shown in FIG. 7, the pillar 11 is disposed on the vibrating membrane 3 such that the center of the vibrating membrane 3 and the center of the circularly-shaped pillar 11 coincide. A plurality of vibrating portions 14E to 14J are formed in a region between a portion of the vibrating membrane 3, which is joined to the pillar 11, and the peripheral portion of the vibrating membrane 3. Therefore, the pillar side slits 12E to 12J and the peripheral portion side slits 13E to 13J are disposed around the pillar 11. In the present embodiment shown in FIG. 7, an example is shown, in which six of the vibrating portions 14E to 14J are formed.

One vibrating portion being taken as an example will be described in detail. In the vibrating portion 14E formed in the upper-right side region of the vibrating membrane 3 with respect to the pillar 11 shown in FIG. 7, the pillar side slit 12E is formed by the first slit portion 12*a* and a second slit portion 12*b*, the first slit portion 12*a* extending from the pillar 11 side in the upward direction of the drawing which is parallel to the radial direction of the vibrating membrane 3, and the second slit portion 12*b* extending from the pillar 11 side in the right direction of the drawing which is parallel to the radial direction of the vibrating membrane 3, and being joined to the first slit portion 12*a* such that the second slit portion 12*b* intersects the first slit portion 12*a* at a joining angle of 60 degrees.

By forming the pillar side slit 12E, it is made easy for a part on the pillar 11 side in the vibrating membrane 3 to vibrate, a vibration of which part is restricted by the pillar 11.

Moreover, in the vibrating membrane 3, by forming the peripheral portion side slit 13E at the peripheral portion being joined to the substrate 1, the insulating film 2, and the spacer 4, it is made easy for the peripheral portion of the vibrating membrane 3 to vibrate, a vibration of which peripheral portion is restricted by being joined to the substrate 1 and the like. In order to make a region surrounded by an extension line in the extending direction of the first slit portion 12*a* and an extension line in the extending direction of the second slit portion 12*b*, respectively shown with a double-dashed line in FIG. 7, one vibrating portion, the peripheral portion side slit 13E is formed to open to the positions intersecting the respective extension lines or in proximity thereto.

In this way, a region surrounded by the pillar side slit 12E and the peripheral portion side slit 13E is the one vibrating portion 14E. The vibrating portions 14F to 14J are also similarly formed, respectively. The plurality of vibrating portions 14E to 14J are the six vibrating portions with uniform characteristics by the plurality of vibrating portions 14E to 14J being disposed evenly around the center of the pillar 11 (the center of the vibrating membrane 3).

The vibrating portions 14E to 14J of the present embodiment show a tendency similar to the vibrating portions 14A to 14D of Embodiment 1 above with respect to the vibrating characteristics. Specifically, the vibration characteristics of the vibrating portions 14E to 14J vary depending on the material composing the vibrating membrane 3, the thickness, and the size thereof. Moreover, the vibration characteristics can vary depending on the shape and arrangement of the pillar side slits 12E to 12J and the peripheral portion side slits 13E to 13J.

Therefore, in a manner similar to the vibrating portion in Embodiment 1 above, the vibrating portions 14E to 14J of the MEMS element of the present embodiment also show the vibration characteristics similar to the vibration characteristics shown in FIGS. 3 to 6. Besides, when the vibrating portion in the present embodiment and the vibrating portion in Embodiment 1 are compared in an angle (a joining angle) at which the first slit portion 12*a* and the second slit portion 12*b* of the pillar side slit intersects, the present embodiment is smaller. Here, in a case that the extension lengths of the first slit portion 12*a* and the second slit portion 12*b* are the same, when the joining angle is smaller, the amplitude amount on the side of the pillar is smaller. Moreover, when the joining angle is smaller, the length of the peripheral portion side slit is shorter and the amplitude amount on the side of the peripheral portion is smaller. Therefore, as explained in FIG. 4, it is desirable to achieve the desired vibration characteristics by suitably setting the lengths of the pillar side slits 12E to 12J.

In this way, also in the present embodiment, the amplitude amount of the vibrating membrane 3 can be made to be almost uniform in a region between the pillar side silts 12E to 12J and the respectively corresponding peripheral portion side slits 13E to 13J. This is because the vibrating membrane 3 including the movable electrode of the vibrating portions 14E to 14J is displaced in a manner almost parallel to the opposing fixed electrode 5.

In the present embodiment, as shown in FIG. 7, a vibrating portion is divided into the six vibrating portions 14E to 14J, thereby making a signal output from the respective vibrating portions smaller. However, a plurality of vibrating portions is provided and the area of the vibrating portion that is displaced in a manner almost parallel to the fixed electrode 5 in the radial direction of the vibrating membrane 3 increases; therefore, a sufficiently large sensitivity can be obtained.

Moreover, the vibrating membrane 3 including the movable electrode is displaced in a manner almost parallel to the fixed electrode 5, so that the AOP is improved. Furthermore, when the vibrating membrane 3 that has a small spring constant and vibrates easily is used, it is possible to make the force applied to the respective vibrating portions decrease when a bias voltage is applied between the fixed electrode 5 of the vibrating portion and the movable electrode, resulting in a smaller distortion of the detection signal, making it possible to improve the AOP. Also in the present embodiment, the pillar 11 is provided, so that a problem such as the vibrating membrane 3 vibrating too much, and the like never occurs even with the vibrating membrane 3 having a small spring constant.

Moreover, a configuration in which a plurality of vibrating portions each having equal vibration characteristics is provided is possible and a configuration in which vibrating portions having different vibration characteristics are combined to complement each other is possible.

Embodiment 3

Figure 8:
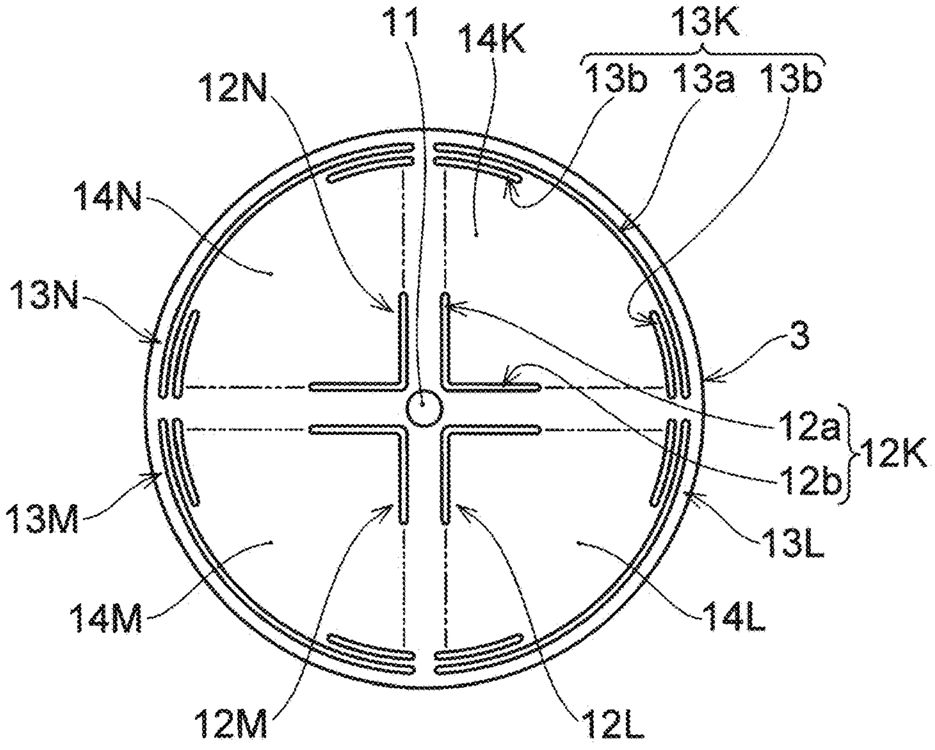
FIG. 8 is a schematic plan view to explain a vibrating membrane portion of the MEMS element being yet another embodiment (Embodiment 3) of the present disclosure.

Next, Embodiment 3 of the MEMS element of the present disclosure will be explained. FIG. 8 is a schematic plan view to explain a vibrating membrane portion of the MEMS element shown in FIG. 1 and is a view to explain the arrangement of the pillar 11, pillar side slits 12K to 12N, and peripheral portion side slits 13K to 13N. The back chamber 9 formed in the substrate 1 in FIG. 1 is circularly shaped and the outer periphery in FIG. 8 corresponds to the outer periphery of the back chamber 9 of the substrate 1. In the MEMS element of the present embodiment shown in FIG. 8, the shape of the peripheral portion side slits 13K to 13N differs in comparison to that in the MEMS element explained in Embodiment 1 shown in FIG. 2.

One vibrating portion being taken as an example will be described in detail. In a vibrating portion 14K formed in the upper-right side region of the vibrating membrane 3 with respect to the pillar 11 shown in FIG. 8, the pillar side slit 12K composed of a first slit portion 12*a* and a second slit portion 12*b* is formed. The pillar side slit 12K corresponds to the pillar side slit 12A shown in FIG. 2. Moreover, the peripheral portion side slit 13K composed of a third slit portion 13*a* and a fourth slit portion 13*b* is formed. The third slit portion 13*a* corresponds to the peripheral portion side slit 13A shown in FIG. 2. In the present embodiment, the fourth slit portion 13*b* is disposed on the pillar 11 side with respect to the third slit portion 13*a*, and the third slit portion 13*a* and the fourth slit portion 13*b* compose the peripheral portion side slit 13K.

In order to make a region surrounded by an extension line in the extending direction of the first slit portion 12*a* and an extension line in the extending direction of the second slit portion 12*b*, respectively shown with a double-dashed line in FIG. 8, one vibrating portion, the peripheral portion side slit 13K composed of the third slit portion 13*a* and the fourth slit portion 13*b* is formed to open to the positions intersecting the respective extension lines or in proximity thereto. Adding the fourth slit portion 13*b* makes it easy for the peripheral portion of the vibrating membrane 3 to vibrate compared to a case in which the peripheral portion side slits 13A to 13D shown in FIG. 2, which are composed of only the third slit portion 13*a*.

In this way, a region surrounded by the pillar side slit 12K and the peripheral portion side slit 13K is the one vibrating portion 14K. Vibrating portions 14L to 14N are also similarly formed, respectively. The plurality of vibrating portions 14K to 14N are the four vibrating portions 14K to 14N with uniform characteristics by the plurality of vibrating portions 14K to 14N being disposed evenly around the center of the pillar 11 (the center of the vibrating membrane 3).

Also in the present embodiment, the material composing the vibrating membrane 3, the thickness, the size thereof, and the shape and arrangement of the pillar side slits 12K to 12N and the peripheral portion side slits 13K to 13N can be set as needed for the vibrating portions 14K to 14N to have desired vibration characteristics.

Besides, the present embodiment has been explained by taking, as an example, the MEMS element comprising the four vibrating portions 14K to 14N, but the present embodiment can also be applied to the MEMS element comprising the six vibrating portions as shown in Embodiment 2 above. When the number of vibrating portions increases, the length of the peripheral portion side slit is shorter, and the amplitude amount of vibration of the peripheral portion of the vibrating membrane 3 is smaller, so that, to increase the amplitude amount of the peripheral portion, the MEMS element is preferably configured to include the fourth slit portion to change the amplitude amount of the peripheral portion to result in a desired amplitude characteristic.

In this way, also in the present embodiment, the amplitude amount of the vibrating membrane 3 can be made to be almost uniform in a region between the pillar side silts 12K to 12N and the respectively corresponding peripheral portion side slits 13K to 13N.

Also in the present embodiment, a vibrating portion is divided into the plurality of vibrating portions, thereby making a signal output from the respective vibrating portions 14K to 14N smaller. However, the plurality of vibrating portions 14K to 14N are provided and the area of the vibrating portion that is displaced in a manner almost parallel to the fixed electrode 5 in the radial direction of the vibrating membrane 3 increases, therefore, it is possible to obtain a sufficiently large sensitivity. In particular, in the present embodiment, the amplitude amount of the peripheral portion of the vibrating membrane 3 increases, therefore, it is possible to obtain a sensitivity larger than that in the MEMS element explained in Embodiment 1.

Moreover, the vibrating membrane 3 including the movable electrode is displaced in a manner almost parallel to the fixed electrode 5, so that the AOP is improved. Furthermore, when the vibrating membrane 3 that has a small spring constant and vibrates easily is used, it is possible to make the force applied to the respective vibrating portions decrease when a bias voltage is applied between the fixed electrode 5 of the vibrating portion and the movable electrode, resulting in a smaller distortion of the detection signal, making it possible to improve the AOP. Also in the present embodiment, the pillar 11 is provided, so that a problem such as the vibrating membrane 3 vibrating too much, and the like never occurs even with the vibrating membrane 3 having a small spring constant.

Moreover, a configuration in which a plurality of vibrating portions each having equal vibration characteristics is provided is possible and a configuration in which vibrating portions having different vibration characteristics are combined to complement each other is possible.

Embodiment 4

Figure 9:
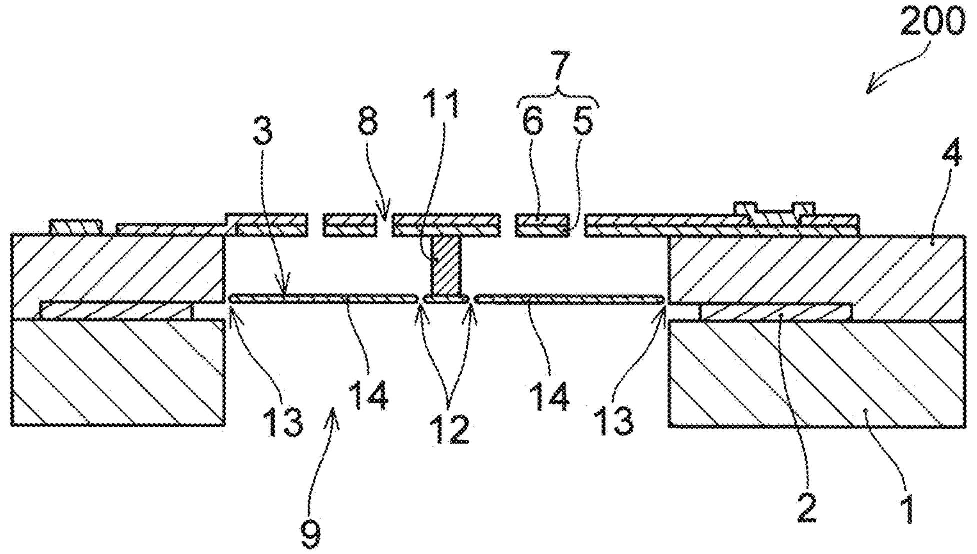
FIG. 9 is a schematic cross-sectional view of the MEMS element being yet a further embodiment (Embodiment 4) of the present disclosure.
Figure 10:
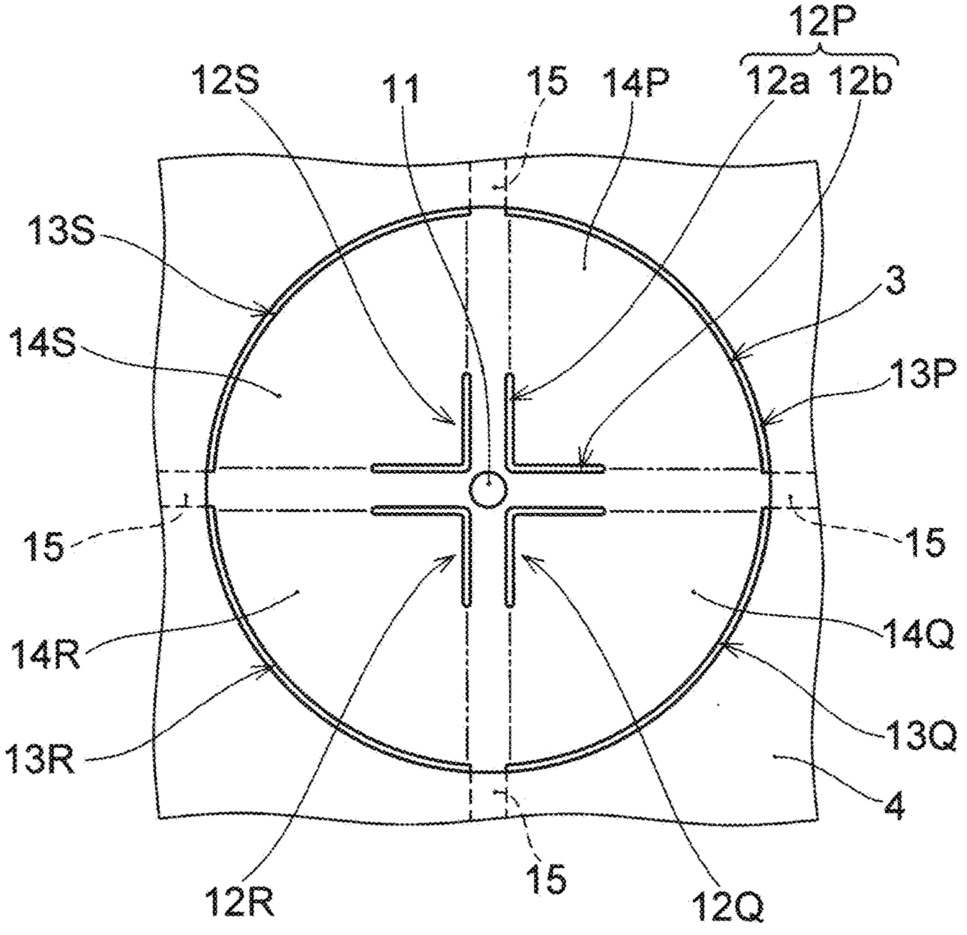
FIG. 10 is a schematic plan view to explain a vibrating membrane portion of Embodiment 4.
Figure 11:
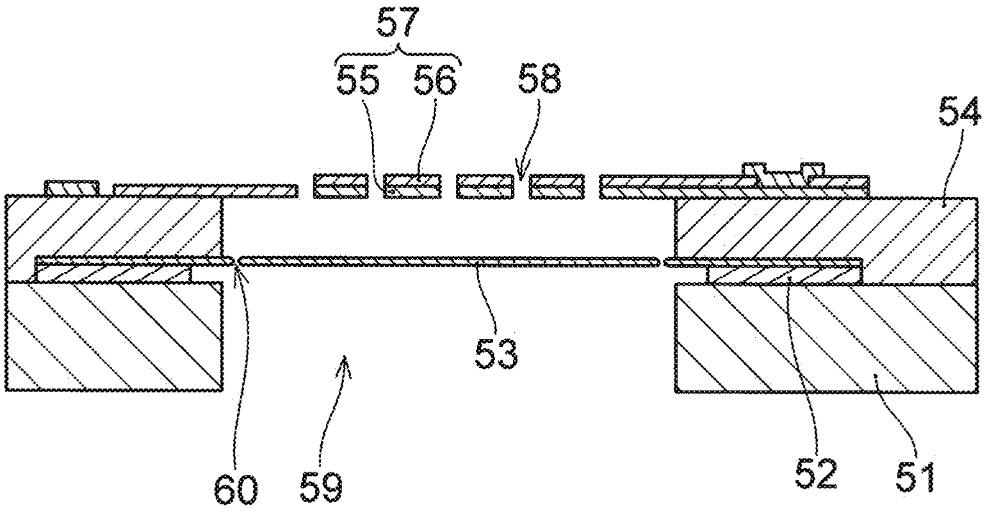
FIG. 11 is a schematic cross-sectional view of a conventional capacitance-type MEMS element.

Next, Embodiment 4 of the MEMS element of the present disclosure will be explained. In Embodiments 1 to 3 above, the peripheral portion side slits 13 are through holes of the vibrating membrane 3. On the contrary, as shown in FIG. 9, peripheral portion side slits 13P to 13S of the present embodiment differ, from the peripheral portion side slits 13, in that the peripheral portion side slits 13P to 13S are openings formed by the open end of the vibrating membrane 3 and the surface facing the open end. FIG. 9 is a schematic cross-sectional view to explain Embodiment 4 of the MEMS element of the present disclosure. FIG. 10 is a schematic plan view to explain a vibrating membrane portion of the MEMS element shown in FIG. 9 and is a schematic plan view as viewed from the side of the backplate 7, excluding the backplate 7. Compared to the MEMS element 100 shown in FIG. 1, which is explained in Embodiment 1 above, a MEMS element 200 according to the present embodiment differs in the supporting structure of the vibrating membrane 3 including the movable electrode, and the end of a part of the vibrating membrane 3 is the open end.

In the MEMS element of the present embodiment, the end of the vibrating membrane 3, which is a part of the vibrating membrane 3 and faces the substrate 1, the insulating film 2, or the spacer 4, is an open end, while a part of the vibrating membrane 3 which is not an open end is a support portion 15. The schematic cross-sectional view shown in FIG. 9 is a cross-sectional view passing through, in FIG. 10, the center of the pillar 11 and two pillar side slits 12P and 12R, or 12Q and 12S facing each other with the pillar 11 as the center. Therefore, the support portion 15 of the vibrating membrane 3 is not shown in FIG. 9 and the support portion 15 of the vibrating membrane 3 is laminated on the insulating film 2 in a region not shown and the spacer 4 is laminated on the support portion 15.

In the MEMS element of the present embodiment, the end of the vibrating membrane 3 is an open end, and a gap between the open end, and the surface facing the open end, or specifically the spacer 4, corresponds to the peripheral portion slits 13P to 13S.

The peripheral portion side slits 13P to 13S correspond to the peripheral portion side slits 13A to 13N explained in Embodiments 1 to 3 above. Therefore, as shown in FIG. 10, in a case that a portion of the vibrating membrane 3 which corresponds to the back chamber 9 is circularly shaped, the pillar 11 is disposed on the vibrating membrane 3 such that the center of the vibrating membrane 3 and the center of the circularly-shaped pillar 11 coincide. A plurality of vibrating portions 14P to 14S is formed in a region between a portion of the vibrating membrane 3, which is joined to the pillar 11, and the open end of the vibrating membrane 3. Therefore, the pillar side slits 12P to 12S and the peripheral portion side slits 13P to 13S are disposed around the pillar 11. In the present embodiment shown in FIG. 10, an example in which the four vibrating portions 14P to 14S are formed is shown.

One vibrating portion being taken as an example will be described in detail. In the vibrating portion 14P formed in the upper-right side region of the vibrating membrane 3 with respect to the pillar 11 shown in FIG. 10, the pillar side slit 12P is formed by a first slit portion 12*a* and a second slit portion 12*b*, the first slit portion 12*a* extending from the pillar 11 side in the upward direction of the drawing which is parallel to the radial direction of the vibrating membrane 3, and the second slit portion 12*b* extending from the pillar 11 side in the right direction of the drawing which is parallel to the radial direction of the vibrating membrane 3, and being joined to the first slit portion 12*a* such that the second slit portion 12*b* intersects the first slit portion 12*a* at a joining angle of 90 degrees.

By forming the pillar side slit 12P, it is made easy for a part on the pillar 11 side in the vibrating membrane 3 to vibrate, a vibration of which part is restricted by the pillar 11.

In order to make a region surrounded by an extension line in the extending direction of the first slit portion 12*a* and an extension line in the extending direction of the second slit portion 12*b*, respectively shown with a double-dashed line in FIG. 10, one vibrating portion, the peripheral portion side slit 13P formed by the open end of the vibrating membrane 3 is formed to open to the positions intersecting the respective extension lines or in proximity thereto.

In this way, a region surrounded by the pillar side slit 12P and the peripheral portion side slit 13P is the one vibrating portion 14P. The vibrating portions 14Q to 14S are also similarly formed, respectively. The plurality of vibrating portions 14P to 14S are the four vibrating portions with uniform characteristics by the plurality of vibrating portions 14P to 14S being disposed evenly around the center of the pillar 11 (the center of the vibrating membrane 3).

The vibrating portions 14P to 14S of the present embodiment show a tendency similar to the vibrating portions 14A to 14D of Embodiment 1 above with respect to the vibrating characteristics. Specifically, the vibration characteristics of the vibrating portions 14P to 14S vary depending on the material composing the vibrating membrane 3, the thickness, and the size thereof. Moreover, the vibration characteristics vary depending on the shape and arrangement of the pillar side slits 12P to 12S.

Therefore, in a manner similar to the vibrating portion in Embodiment 1 above, the vibrating portions 14P to 14S of the MEMS element of the present embodiment also show the vibration characteristics similar to the vibration characteristics shown in FIGS. 3 to 6. Besides, when the vibrating portion in the present embodiment and the vibrating portion in Embodiment 1 are compared, the vibrating membrane 3 in the present embodiment is joined to the substrate 1 and the like at a portion with a small area, so that it is not easily affected by the deformation and the like of the substrate 1.

In this way, also in the present embodiment, the amplitude amount of the vibrating membrane 3 can be made to be almost uniform in a region between the pillar side silts 12P to 12S and the respectively corresponding peripheral portion side slits 13P to 13S. This is because the vibrating membrane 3 including the movable electrode of the vibrating portions 14P to 14S is displaced in a manner almost parallel to the fixed electrode 5 that the vibrating membrane 3 faces.

In the present embodiment, as shown in FIG. 10, a vibrating portion is divided into the four vibrating portions 14P to 14S, thereby making a signal output from the respective vibrating portions smaller. However, a plurality of vibrating portions is provided and the area of the vibrating portion that can be displaced in a manner almost parallel to the fixed electrode 5 in the radial direction of the vibrating membrane 3 increases; therefore, a sufficiently large sensitivity can be obtained.

Moreover, the vibrating membrane 3 including the movable electrode is displaced in a manner almost parallel to the fixed electrode 5, so that the AOP is improved. Furthermore, when the vibrating membrane 3 that has a small spring constant and vibrates easily is used, it is possible to make the force applied to the respective vibrating portions decrease when a bias voltage is applied between the fixed electrode 5 of the vibrating portion and the movable electrode, resulting in a smaller distortion of the detection signal, making it possible to improve the AOP. Also in the present embodiment, the pillar 11 is provided, so that a problem such as the vibrating membrane 3 vibrating too much, and the like never occurs even with the vibrating membrane 3 having a small spring constant.

Besides, a MEMS element comprising the four vibrating portions 14P to 14S taken as an example has been explained for the present embodiment, but the present embodiment can also be applied to a MEMS element comprising the six vibrating portions as shown in Embodiment 2 above. In this case, the number of support portions 15 can be set to be six. Besides, to increase the amplitude amount in proximity to the support portion 15, as explained in Embodiment 3 above, the peripheral portion side slits 13P to 13S can be configured to comprise fourth slit portions 13*b* respectively and the amplitude amount in proximity to the support portion 15 of the vibrating membrane 3 can also be changed to result in a desired vibration characteristic.

Moreover, a configuration in which a plurality of vibrating portions each having equal vibration characteristics is provided is possible and a configuration in which vibrating portions having different vibration characteristics are combined to complement each other.

SUMMARY (1) A MEMS element of the present disclosure, in one embodiment, comprises: a substrate comprising a back chamber; a vibrating membrane joined onto the substrate, wherein the vibrating membrane comprises a movable electrode; and a backplate comprising a fixed electrode disposed so as to face the movable electrode, wherein the vibrating membrane has, at a central portion thereof, a pillar that connects the backplate and the vibrating membrane; and has a plurality of vibrating portions in a region between a portion in which the pillar and the vibrating membrane are joined and a peripheral portion of the vibrating membrane; and wherein each of the plurality of vibrating portions is formed by a region surrounded by a pillar side slit by a first slit portion and a second slit portion joined and a peripheral portion side slit disposed at the peripheral portion between an extension line toward the peripheral portion from the first slit portion and an extension line toward the peripheral portion from the second slit portion, the first slit portion and the second slit portion extending in mutually different directions toward the peripheral portion from a portion side in which the pillar and the vibrating membrane are joined.

According to the MEMS element of the present embodiment, a pillar joined to a backplate is disposed at the central portion of a vibrating membrane, thereby the amplitude at the center of the vibrating membrane is suppressed and, moreover, the vibrating membrane is provided with pillar side slits and peripheral portion slits, thereby making it possible to form a vibrating portion in which the difference in the amplitude amount is small between the central portion and the peripheral portion of the vibrating membrane. This vibrating portion is formed in a plurality, making it possible to obtain a large detection signal as a whole. Furthermore, by increasing the amplitude of the vibrating portion and dividing a vibrating portion into a plurality of vibrating portions, when a bias voltage is applied between a fixed electrode of the vibrating portion and a movable electrode, a force applied to the respective vibrating portions can be reduced, reducing the distortion of a detection signal.

(2) Configuring the pillar side slit to be an opening passing through the vibrating membrane and the peripheral portion side slit to be an opening passing through the vibrating membrane or an opening between an open end of the vibrating membrane and a surface facing the open end makes it possible to easily change the vibration characteristic of the vibrating membrane.

(3) The peripheral portion side slit can be configured to include a third slit portion formed along an inner side of the peripheral portion of the vibrating membrane and a fourth slit portion formed along the third slit portion on a pillar side of the third slit portion and adding the fourth slit portion makes it easy for the peripheral portion of the vibrating membrane to vibrate.

(4) The plurality of vibrating portions can be configured to be vibrating portions respectively having the same vibrating characteristics, thereby a large detection signal can be obtained.

(5) The plurality of vibrating portions can be configured to include at least two vibrating portions having mutually different vibrating characteristics to thereby change the vibration characteristic of the central portion or the peripheral portion of the vibrating membrane respectively to form a vibrating portion in which the difference in the amplitude amount is small between the central portion and the peripheral portion of the vibrating membrane and obtain an even larger detection signal.

(6) The plurality of vibrating portions all can be configured to have the pillar side slits of the same shapes and the peripheral portion slits of the same shapes, making it possible to obtain a large detection signal.

(7) The plurality of vibrating portions can be configured to have at least two vibrating portions having at least either one of the pillar side slits of mutually different shapes and the peripheral portion side slits of mutually different shapes to thereby change the vibration characteristic of the central portion or the peripheral portion of the vibrating membrane respectively to form a vibrating portion in which the difference in the amplitude amount is small between the central portion and the peripheral portion of the vibrating membrane and obtain an even larger detection signal.

(8) The first slit portion and the second slit portion composing the pillar side slit can be configured to be formed with a length and/or a joining angle with which a predetermined vibrating characteristic is obtained to thereby change the vibration characteristic of the central portion of the vibrating membrane to form a vibrating portion in which the difference in the amplitude amount is small between the central portion and the peripheral portion of the vibrating membrane and obtain an even larger detection signal.

REFERENCE SIGNS LIST

1 SUBSTRATE
2 INSULATING FILM
3 VIBRATING MEMBRANE
4 SPACER
FIXED ELECTRODE
6 INSULATING FILM
7 BACKPLATE
8 ACOUSTIC HOLE
9 BACK CHAMBER
SLIT
11 PILLAR
12, 12A to 12N, 12P to 12S PILLAR SIDE SLITS

12*a* FIRST SLIT PORTION
12*b* SECOND SLIT PORTION
13, 13A to 13N, 13P to 13S PERIPHERAL PORTION SIDE SLITS
13*a* THIRD SLIT PORTION
13*b* FOURTH SLIT PORTION
14, 14A to 14N, 14P to 14S VIBRATING PORTION SUPPORT PORTION

The invention claimed is:

1. A MEMS element comprising:

a substrate comprising a back chamber;

a vibrating membrane joined onto the substrate, wherein the vibrating membrane comprises a movable electrode; and a backplate comprising a fixed electrode disposed so as to face the movable electrode, wherein the vibrating membrane:

has, at a central portion thereof, a pillar that connects the backplate and the vibrating membrane; and has a plurality of vibrating portions in a region between a portion in which the pillar and the vibrating membrane are joined and a peripheral portion of the vibrating membrane, and wherein each of the plurality of vibrating portions is formed by a region surrounded by a pillar side slit by a first slit portion and a second slit portion joined and a peripheral portion side slit disposed at the peripheral portion between an extension line toward the peripheral portion from the first slit portion and an extension line toward the peripheral portion from the second slit portion, the first slit portion and the second slit portion extending in mutually different directions toward the peripheral portion from a portion side in which the pillar and the vibrating membrane are joined.

2. The MEMS element according to claim 1, wherein the pillar side slit consists of an opening passing through the vibrating membrane and the peripheral portion side slit consists of an opening passing through the vibrating membrane or an opening between an open end of the vibrating membrane and a surface facing the open end.

3. The MEMS element according to claim 2, wherein the peripheral portion side slit comprises a third slit portion formed along an inner side of the peripheral portion of the vibrating membrane and a fourth slit portion formed along the third slit portion on a pillar side of the third slit portion.

4. The MEMS element according to claim 2, wherein the plurality of vibrating portions are vibrating portions respectively having same vibrating characteristics.

5. The MEMS element according to claim 2, wherein the plurality of vibrating portions comprises at least two vibrating portions having mutually different vibrating characteristics.

6. The MEMS element according to claim 2, wherein the plurality of vibrating portions all have the pillar side slits of same shapes and the peripheral portion slits of same shapes.

7. The MEMS element according to claim 2, wherein the plurality of vibrating portions comprises at least two vibrating portions having at least either one of the pillar side slits of mutually different shapes and the peripheral portion side slits of mutually different shapes.

8. The MEMS element according to claim 2, wherein the first slit portion and the second slit portion composing the pillar side slit are formed with a length and/or a joining angle with which a predetermined vibrating characteristic is obtained.

9. The MEMS element according to claim 1, wherein the peripheral portion side slit comprises a third slit portion formed along an inner side of the peripheral portion of the vibrating membrane and a fourth slit portion formed along the third slit portion on a pillar side of the third slit portion.

10. The MEMS element according to claim 9, wherein the plurality of vibrating portions are vibrating portions respectively having same vibrating characteristics.

11. The MEMS element according to claim 9, wherein the plurality of vibrating portions comprises at least two vibrating portions having mutually different vibrating characteristics.

12. The MEMS element according to claim 9, wherein the plurality of vibrating portions all have the pillar side slits of same shapes and the peripheral portion slits of same shapes.

13. The MEMS element according to claim 9, wherein the plurality of vibrating portions comprises at least two vibrating portions having at least either one of the pillar side slits of mutually different shapes and the peripheral portion side slits of mutually different shapes.

14. The MEMS element according to claim 1, wherein the plurality of vibrating portions are vibrating portions respectively having same vibrating characteristics.

15. The MEMS element according to claim 14, wherein the plurality of vibrating portions all have the pillar side slits of same shapes and the peripheral portion slits of same shapes.

16. The MEMS element according to claim 1, wherein the plurality of vibrating portions comprises at least two vibrating portions having mutually different vibrating characteristics.

17. The MEMS element according to claim 16, wherein the plurality of vibrating portions comprises at least two vibrating portions having at least either one of the pillar side slits of mutually different shapes and the peripheral portion side slits of mutually different shapes.

18. The MEMS element according to claim 1, wherein the plurality of vibrating portions all have the pillar side slits of same shapes and the peripheral portion slits of same shapes.

19. The MEMS element according to claim 1, wherein the plurality of vibrating portions comprises at least two vibrating portions having at least either one of the pillar side slits of mutually different shapes and the peripheral portion side slits of mutually different shapes.

20. The MEMS element according to claim 1, wherein the first slit portion and the second slit portion composing the pillar side slit are formed with a length and/or a joining angle with which a predetermined vibrating characteristic is obtained.

* * * * *